US008645093B2

(12) United States Patent
Brunner

(10) Patent No.: US 8,645,093 B2
(45) Date of Patent: Feb. 4, 2014

(54) CALIBRATING MULTI-DIMENSIONAL SENSOR FOR OFFSET, SENSITIVITY, AND NON-ORTHOGONALITY

(75) Inventor: Christopher Brunner, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 309 days.

(21) Appl. No.: 12/612,563

(22) Filed: Nov. 4, 2009

(65) Prior Publication Data

US 2011/0106477 A1 May 5, 2011

(51) Int. Cl.
*G01D 3/02* (2006.01)
*G01S 3/74* (2006.01)
*G01R 33/025* (2006.01)

(52) U.S. Cl.
USPC ............... 702/104; 702/92; 702/93; 702/196; 324/245; 324/246

(58) Field of Classification Search
USPC ............... 702/104, 92, 93, 196; 324/245, 246
See application file for complete search history.

(56) References Cited

U.S. PATENT DOCUMENTS

| | | | |
|---|---|---|---|
| 5,761,094 A | 6/1998 | Olson et al. | |
| 6,401,047 B1 | 6/2002 | Voto et al. | |
| 6,577,976 B1 | 6/2003 | Hoff et al. | |
| 6,877,237 B1 | 4/2005 | Withanawasam | |
| 7,119,533 B2 | 10/2006 | Tamura et al. | |
| 7,210,236 B2 | 5/2007 | Sato et al | |
| 7,216,055 B1 * | 5/2007 | Horton et al. | 702/153 |
| 7,602,855 B2 * | 10/2009 | Koo et al. | 375/267 |
| 7,613,581 B2 * | 11/2009 | Skvortsov et al. | 702/92 |
| 7,711,762 B2 * | 5/2010 | Howard et al. | 708/490 |
| 7,826,999 B1 | 11/2010 | Boeen et al. | |
| 7,881,247 B2 * | 2/2011 | Pan et al. | 370/319 |
| 7,895,254 B2 * | 2/2011 | Ketchum et al. | 708/520 |
| 7,930,148 B1 * | 4/2011 | Figaro et al. | 702/196 |

(Continued)

FOREIGN PATENT DOCUMENTS

| | | |
|---|---|---|
| EP | 0756179 A2 | 1/1997 |
| EP | 1903305 A2 | 3/2008 |

(Continued)

OTHER PUBLICATIONS

Camps, F., "Numerical calibration for 3-axis accelerometers and magnetometers", Issue Date: Jun. 7-9, 2009, '09. IEEE International Conference on Electro/Information Technology, 2009, pp. 217-221.*

(Continued)

*Primary Examiner* — Sujoy Kundu
*Assistant Examiner* — Regis Betsch
(74) *Attorney, Agent, or Firm* — Jennifer M. Pascua

(57) ABSTRACT

A multi-dimensional sensor, a magnetometer or accelerometer, is calibrated based on the raw data provided by the sensor. Raw data is collected and may be used to generate ellipse or ellipsoid parameters, for a two-dimensional or three-dimensional sensor, respectively. An offset calibration factor is calculated based on the raw data, e.g., the determined ellipse or ellipsoid parameters. A sensitivity calibration factor is then calculated based on the offset calibration factor and the raw data. A non-orthogonality calibration factor can then be calculated based on the calculated offset and sensitivity calibration factors. Using the offset, sensitivity and non-orthogonality calibration factors, the raw data can be corrected to produce calibrated data.

39 Claims, 4 Drawing Sheets

(56) References Cited

U.S. PATENT DOCUMENTS

| | | | |
|---|---|---|---|
| 7,937,217 | B2 | 5/2011 | Okeya |
| 8,044,841 | B1 * | 10/2011 | Boardman et al. ............... 342/62 |
| 2002/0083605 | A1 | 7/2002 | Blank et al. |
| 2003/0140510 | A1 | 7/2003 | Woods et al. |
| 2005/0091861 | A1 | 5/2005 | Parks et al. |
| 2005/0253806 | A1 * | 11/2005 | Liberty et al. ................. 345/156 |
| 2007/0055468 | A1 * | 3/2007 | Pylvanainen .................... 702/92 |
| 2008/0051987 | A1 | 2/2008 | Okeya |
| 2008/0103655 | A1 | 5/2008 | Turnbull et al. |
| 2008/0317156 | A1 * | 12/2008 | Sivanesan et al. ............. 375/267 |
| 2009/0167295 | A1 | 7/2009 | Chen et al. |
| 2009/0320305 | A1 | 12/2009 | Ito et al. |
| 2010/0033424 | A1 | 2/2010 | Kabasawa et al. |
| 2010/0121599 | A1 * | 5/2010 | Boeve et al. ..................... 702/93 |
| 2011/0106474 | A1 | 5/2011 | Kulik et al. |
| 2011/0106477 | A1 * | 5/2011 | Brunner ........................ 702/104 |
| 2013/0006573 | A1 | 1/2013 | Brunner et al. |

FOREIGN PATENT DOCUMENTS

| | | | |
|---|---|---|---|
| EP | 2009393 | A1 | 12/2008 |
| JP | 8313261 | A | 11/1996 |
| JP | 2004309227 | A | 11/2004 |
| JP | 2005291934 | A | 10/2005 |
| JP | 2005315650 | A | 11/2005 |
| JP | 2006005540 | A | 1/2006 |
| JP | 2007524805 | A | 8/2007 |
| JP | 2007256161 | A | 10/2007 |
| JP | 2007271454 | A | 10/2007 |
| JP | 2008076397 | A | 4/2008 |
| KR | 20060133078 | A | 12/2006 |
| TW | 200610974 | A | 4/2006 |
| TW | 200905165 | A | 2/2009 |
| TW | 200907300 | A | 2/2009 |
| WO | 2004076971 | A2 | 9/2004 |
| WO | WO2007026238 | A1 | 3/2007 |
| WO | 2007114236 | A1 | 10/2007 |
| WO | 2009068116 | A1 | 6/2009 |

OTHER PUBLICATIONS

Brown, A., "The derivation of the velocity ellipsoid from proper motions", 1941, Monthly Notices of the Royal Astronomical Society, vol. 101, p. 284, http://adsabs.harvard.edu/full/1941MNRAS.101..284B.*

C.C. Foster, G.H. Elkaim, "Extension of a Two Step Calibration Methodology to Include Non-Orthogonal Sensors"; IEEE Transactions on Aerospace and Electronic Systems, Jul. 2008, pp. 1070-1078.

C. Michalke, M. Stege, F. Schafer, and G. Fettweis, "Efficient tracking of eigenspaces and its application to eigenbeamforming", PIMRC 2003 vol. 3 (2003) pp. 2847-2851.

International Search Report and Written Opinion—PCT/US2010/055303, International Search Authority—European Patent Office—Mar. 8, 2011.

Taiwan Search Report—TW099137981—TIPO—May 14, 2013.

* cited by examiner

CALIBRATING MULTI-DIMENSIONAL SENSOR FOR OFFSET, SENSITIVITY, AND NON-ORTHOGONALITY

BACKGROUND

Multi-dimensional sensors, such as magnetometers and accelerometers, are increasingly used in mobile applications for location or orientation awareness. For example, a tilt compensated digital compass may be used in applications such as pedestrian navigation. A tilt compensated digital compass includes a three-dimensional magnetometer to measure the Earth's magnetic field and a three-dimensional accelerometer for tilt compensation.

Mobile applications typically require compact and low power components. Current electro-mechanical (MEM) type magnetometers and accelerometers fulfill these requirements and are accurate and reliable. The main challenge in incorporating magnetometers and accelerometers, such as that used in a tilt compensated digital compass, into mobile devices, is calibration of the sensors.

One article that discusses calibration of a multi-dimensional sensor, in particular a magnetometer, is entitled "Extension of a Two Step Calibration Methodology to Include Non-Orthogonal Sensors"; C. C. Foster, G. H. Elkaim; IEEE Transactions on Aerospace and Electronic Systems, July 2008, p. 1070-78, which is incorporated herein by reference. This article, however, does not discuss how to map ellipse and ellipsoid parameters to sensor calibration parameters (offsets, sensitivities, non-orthogonalities). These parameters are needed to convert raw sensor data to calibrated sensor data.

Mobile applications in which a sensor may be found, e.g., such as a cellular telephone, are mass produced and, thus, the multi-dimensional sensors cannot be factory-calibrated individually as is the case with more specialized equipment as the cost would be prohibitive. Accordingly, auto-calibration of multi-dimensional sensors is desired.

SUMMARY

A multi-dimensional sensor, such as a two-dimensional or three-dimensional magnetometer or accelerometer, is calibrated based on the raw data provided by the sensor. The raw data is collected and may be used to generate ellipse or ellipsoid parameters, for a two-dimensional or three-dimensional sensor, respectively. Moreover, a three-dimensional sensor can be calibrated in two dimensions for different planes which is relevant for the tilt compensated digital compass. An offset calibration factor for each axis of the multi-dimensional sensor is calculated based on the determined ellipse or ellipsoid parameters. A sensitivity calibration factor is then calculated based on the offset calibration factor and the raw data. A non-orthogonality calibration factor can then be calculated based on the calculated offset and sensitivity calibration factors. Using the offset, sensitivity and non-orthogonality calibration factors, the raw data can be corrected to produce calibrated data.

DETAILED DESCRIPTION

Figure 1:
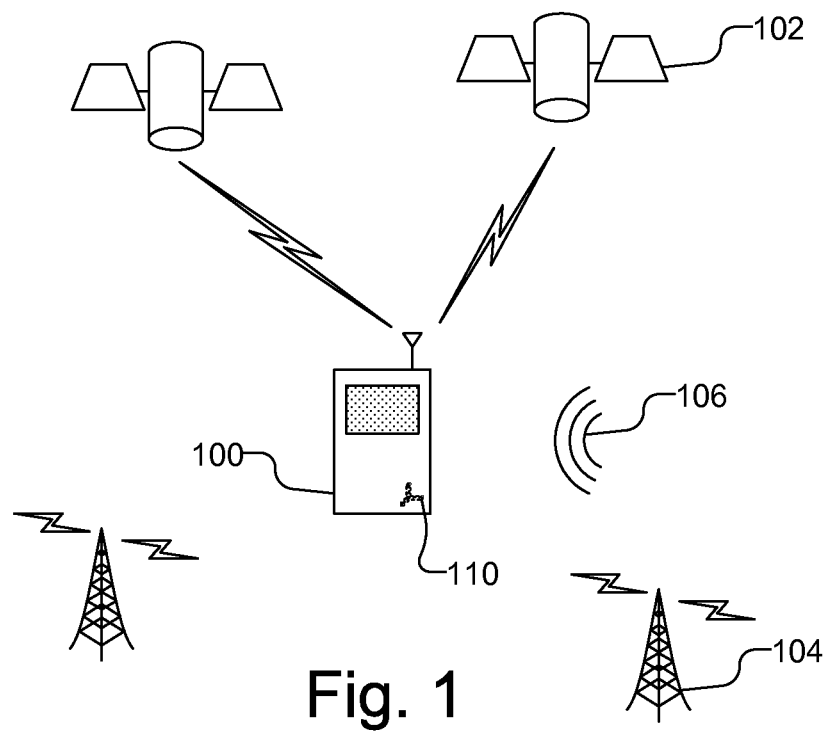
FIG. 1 illustrates a mobile station that performs an auto-calibration of one or multiple multi-dimensional sensors.

FIG. 1 illustrates a mobile station 100 that performs an auto-calibration of a multi-dimensional sensor 110, which may be used to assist in navigation and/or orientation of the mobile station 100. The multi-dimensional sensor 110 may be, e.g., a two-dimensional or a three-dimensional sensor, and may be, e.g., a magnetometer that measures the Earth's magnetic field or an accelerometer that measures acceleration on the mobile station 100. The offset, sensitivity and non-orthogonality of the multi-dimensional sensor 110 are calibrated based on the raw data provided by the multi-dimensional sensor 110 while the sensor is in use.

As used herein, a mobile station (MS) refers to a device such as a cellular or other wireless communication device, personal communication system (PCS) device, personal navigation device (PND), Personal Information Manager (PIM), Personal Digital Assistant (PDA), laptop or other suitable mobile device which is capable of receiving wireless communication and/or navigation signals, such as navigation positioning signals. The term "mobile station" is also intended to include devices which communicate with a personal navigation device (PND), such as by short-range wireless, infrared, wireline connection, or other connection—regardless of whether satellite signal reception, assistance data reception, and/or position-related processing occurs at the device or at the PND. Also, "mobile station" is intended to include all devices, including wireless communication devices, computers, laptops, etc. which are capable of communication with a server, such as via the Internet, WiFi, or other network, and regardless of whether satellite signal reception, assistance data reception, and/or position-related processing occurs at the device, at a server, or at another device associated with the network. Any operable combination of the above are also considered a "mobile station."

A satellite positioning system (SPS) typically includes a system of transmitters positioned to enable entities to determine their location on or above the Earth based, at least in part, on signals received from the transmitters. Such a transmitter typically transmits a signal marked with a repeating pseudo-random noise (PN) code of a set number of chips and may be located on ground based control stations, user equipment and/or space vehicles. In a particular example, such transmitters may be located on Earth orbiting satellite vehicles (SVs) 102, illustrated in FIG. 1. For example, a SV in a constellation of Global Navigation Satellite System (GNSS) such as Global Positioning System (GPS), Galileo, Glonass or Compass may transmit a signal marked with a PN code that is distinguishable from PN codes transmitted by other SVs in the constellation (e.g., using different PN codes for each satellite as in GPS or using the same code on different frequencies as in Glonass).

In accordance with certain aspects, the techniques presented herein are not restricted to global systems (e.g., GNSS)

for SPS. For example, the techniques provided herein may be applied to or otherwise enabled for use in various regional systems, such as, e.g., Quasi-Zenith Satellite System (QZSS) over Japan, Indian Regional Navigational Satellite System (IRNSS) over India, Beidou over China, etc., and/or various augmentation systems (e.g., an Satellite Based Augmentation System (SBAS)) that may be associated with or otherwise enabled for use with one or more global and/or regional navigation satellite systems. By way of example but not limitation, an SBAS may include an augmentation system(s) that provides integrity information, differential corrections, etc., such as, e.g., Wide Area Augmentation System (WAAS), European Geostationary Navigation Overlay Service (EGNOS), Multi-functional Satellite Augmentation System (MSAS), GPS Aided Geo Augmented Navigation or GPS and Geo Augmented Navigation system (GAGAN), and/or the like. Thus, as used herein an SPS may include any combination of one or more global and/or regional navigation satellite systems and/or augmentation systems, and SPS signals may include SPS, SPS-like, and/or other signals associated with such one or more SPS.

The mobile station 100, however, is not limited to use with an SPS, but may be implemented in conjunction with various wireless communication networks, including cellular towers 104 and from wireless communication access points 106, such as a wireless wide area network (WWAN), a wireless local area network (WLAN), a wireless personal area network (WPAN), and so on. The term "network" and "system" are often used interchangeably. A WWAN may be a Code Division Multiple Access (CDMA) network, a Time Division Multiple Access (TDMA) network, a Frequency Division Multiple Access (FDMA) network, an Orthogonal Frequency Division Multiple Access (OFDMA) network, a Single-Carrier Frequency Division Multiple Access (SC-FDMA) network, Long Term Evolution (LTE), and so on. A CDMA network may implement one or more radio access technologies (RATs) such as cdma2000, Wideband-CDMA (W-CDMA), and so on. Cdma2000 includes IS-95, IS-2000, and IS-856 standards. A TDMA network may implement Global System for Mobile Communications (GSM), Digital Advanced Mobile Phone System (D-AMPS), or some other RAT. GSM and W-CDMA are described in documents from a consortium named "3rd Generation Partnership Project" (3GPP). Cdma2000 is described in documents from a consortium named "3rd Generation Partnership Project 2" (3GPP2). 3GPP and 3GPP2 documents are publicly available. A WLAN may be an IEEE 802.11x network, and a WPAN may be a Bluetooth network, an IEEE 802.15x, or some other type of network. The techniques may also be implemented in conjunction with any combination of WWAN, WLAN and/or WPAN.

Figure 2:
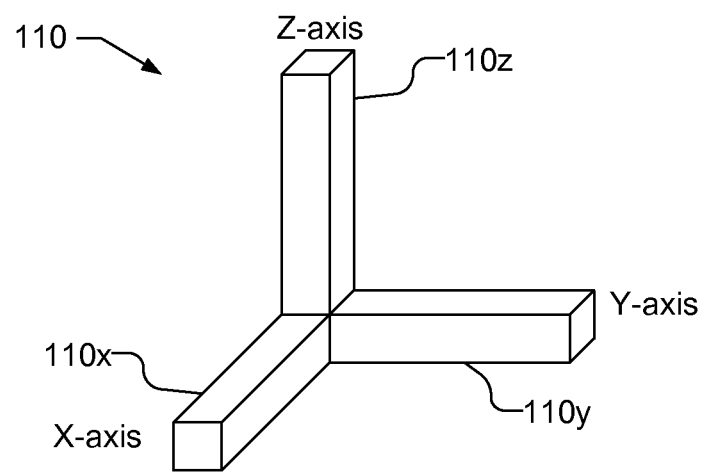
FIG. 2 schematically illustrates a multi-dimensional sensor that may be located within the mobile station of FIG. 1.

FIG. 2 schematically illustrates a multi-dimensional sensor 110, which may be located within mobile station 100. As illustrated in FIG. 2, the multi-dimensional sensor 110 is a three-dimensional sensor that includes a sensor 110x along the X-axis, a sensor 110y along the Y-axis and a third sensor 110z along the Z-axis. The multi-dimensional sensor 110 may be, however, a two-dimensional sensor including only sensor 110x and sensor 110y, along the X and Y axes, respectively. The multi-dimensional sensor 110 provides raw, i.e., uncalibrated, data for each axis, which may be used to determine the rough orientation and/or position of the mobile station 100. More than one multi-dimensional sensor may be used as well, for instance, a three-dimensional accelerometer and a magnetometer may be used as a digital compass.

Figure 3:
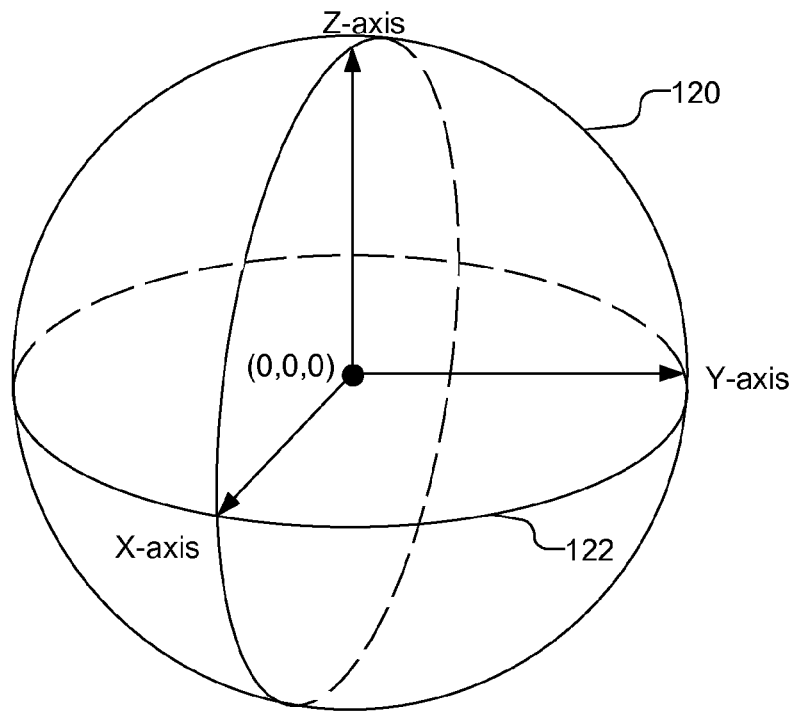
FIG. 3 illustrates a unit circle and unit sphere centered on the origin, which would be produced by the output of an ideal or a calibrated two-dimensional and three-dimensional sensor, respectively, that is extensively rotated.
Figure 4:
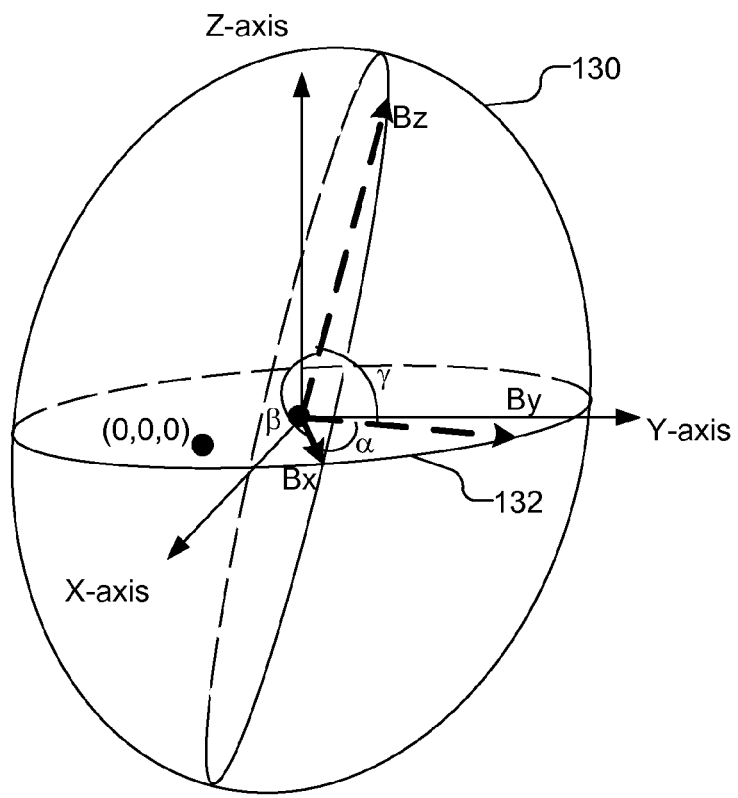
FIG. 4 illustrates an ellipse and ellipsoid offset from the origin, which would be produced by the output of an uncalibrated two-dimensional and three-dimensional sensor, respectively, that is extensively rotated.

Ideally, the raw data output from an extensively rotated multi-dimensional sensor 110 would yield a unit sphere 120 centered on the origin, i.e., (0,0,0), as illustrated in FIG. 3, or a unit circle 122 centered on the origin, i.e., (0,0) in the case of a two-dimensional sensor. In practice, however, several error sources affect the multi-dimensional sensor 110 resulting in an output that is an ellipsoid 130 that is offset from the origin, as illustrated in FIG. 4, or an ellipse 132 in the case of a two-dimensional sensor. Error sources for the multi-dimensional sensor 110 include a DC offset along each axis of the multi-dimensional sensor 110, differing sensitivities of the sensors 110x, 110y, and 110z (if used), and the non-orthogonality between different pairs of the sensors 110x, 110y, and 110z (if used).

The DC offset error is a non-zero bias in the sensors 110x, 110y, and 110z that results in a shift in the value of the outputs of the sensors 110x, 110y, and 110z. The DC offset error may differ for each of the sensors 110x, 110y, and 110z. Hard iron errors in a magnetometer type sensor may be included in the DC offset error. A hard iron error is caused by a magnetometer type sensor detecting a constant magnetic field that is in addition to the Earth's magnetic field. If the source of the hard iron error has a fixed positional relationship with the multi-dimensional sensor 110, resulting in a constant shift in the value of the outputs of the sensors 110x, 110y, and 110z, the hard iron errors are included in the DC offset error. FIG. 4 illustrates the DC offset error as an offset of the ellipsoid 130 or ellipse 132 from the origin (0,0,0).

The sensitivity error is an error source that results from differing sensitivities of the sensors 110x, 110y, and 110z with respect to each other. The sensitivity of a sensor along an axis scales the value of the output of that sensor. One sensor, e.g., sensor 110x, may be more sensitive than another sensor, e.g., sensor 110y, and thus, the values of their outputs are scaled differently. Additionally, soft iron errors in a magnetometer type sensor may be included in the sensitivity error. A soft iron error is caused by materials that emit a variable magnetic field near the multi-dimensional sensor 110. Again, if the source of the soft iron error has a fixed positional relationship with the multi-dimensional sensor 110, resulting in consistent by unequal scaling of the values of the outputs of the sensors 110x, 110y, and 110z, the soft iron errors are included in the sensitivity error. FIG. 4 illustrates the sensitivity error of the sensors 110x, 110y, and 110z with the differing lengths of the vectors labeled Bx, By, and Bz, respectively.

The non-orthogonality error results from the sensors 110x, 110y, and 110z being physically misaligned with the X, Y, and Z axes. As illustrated in FIG. 4, there exists an angle $\alpha$ between the vectors Bx and By, an angle $\beta$ between the vectors Bx and Bz, and an angle $\gamma$ between the vectors By and Bz. The non-orthogonality error $\psi$ between the vectors Bx and By is $0.5*(90°-\alpha)$, and likewise the -orthogonality error $\theta$ between the vectors Bx and Bz is $0.5*(90°-\beta)$ and the -orthogonality error $\phi$ between the vectors By and Bz is $0.5*(90°-\gamma)$. If the multi-dimensional sensor is a two-dimensional sensor, the non-orthogonality error is only a single angle between the two dimensions, e.g., between the vectors Bx and By.

Without correction of the errors sources, the raw data from the multi-dimensional sensor produces an inaccurate measurement. Correction of the raw data may be performed using only the raw data provided by the multi-dimensional sensor 110, e.g., while the sensor is in use, by determining the ellipse (for a two-dimensional sensor or for planes of a three-dimensional sensor) or ellipsoid (for the three-dimensional sensor) parameters and mapping the ellipse or ellipsoid calibration factors.

Figure 5:
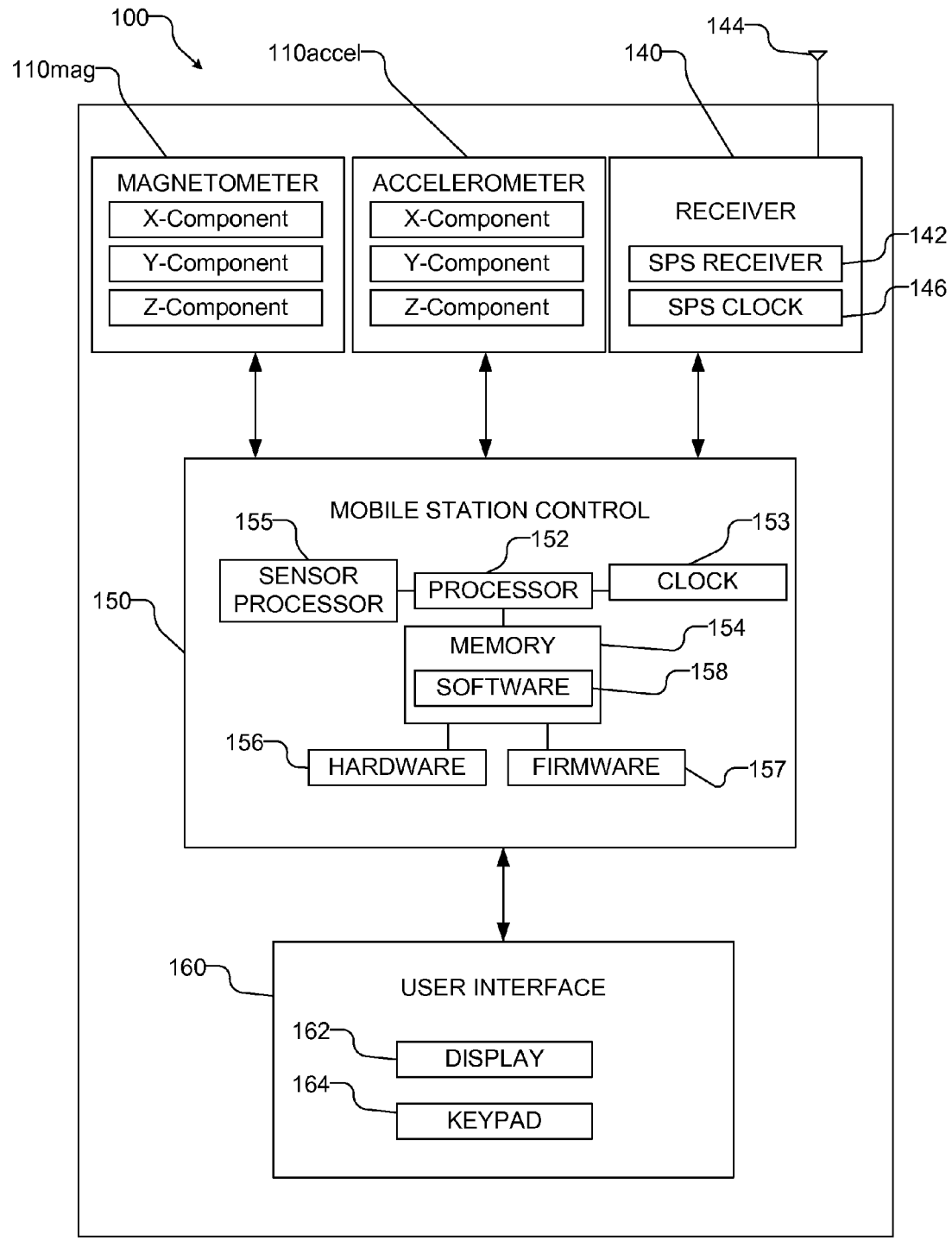
FIG. 5 is a block diagram of a mobile station capable of auto-calibration by correcting the raw data from a multi-dimensional sensor based on the collected raw data.

FIG. 5 is a block diagram of the mobile station 100 capable of correcting the raw data from a multi-dimensional sensor 110 using only the raw data provided by the multi-dimensional sensor 110. As illustrated in FIG. 5, the mobile station 100 includes two multi-dimensional sensors, in the form of a three-dimensional magnetometer 110mag and a three-dimensional accelerometer 110accel. The three axes of sensitivity of both the magnetometer 110mag and the accelerometer 110accel are labeled as X-Component, Y-Component, and Z-component. It should be understood that one or both of the magnetometer 110mag and the accelerometer 110accel may have fewer dimensions, i.e., only the X-Component and Y-Component.

Mobile station 100 may also include a receiver 140, such includes a satellite positioning system (SPS) having a SPS receiver 142 that receives signals from a SPS satellites 102 (FIG. 1) via an antenna 144 and a SPS clock 146. As discussed in reference to FIG. 1, the receiver 140 need not be limited to SPS, but may also receive signals from terrestrial sources, such as cellular towers 104 or from wireless communication access points 106. In such embodiments, the receiver 140 may be, e.g., a cellular modem or a wireless network radio receiver/transmitter that is capable of receiving communications from a cellular tower or from a wireless access point, respectively. If desired, separate receivers may be used for SPS signals and terrestrial signals.

The magnetometer 110mag, the accelerometer 110accel and the receiver 140 are connected to and communicate with a mobile station control 150. The mobile station control 150 accepts and processes data from the magnetometer 110mag, the accelerometer 110accel and the receiver 140 and controls the operation of the device. The mobile station control 150 may be provided by a processor 152 and associated memory 154, a clock 153, a dedicated sensor processor 155, hardware 156, software 158, and firmware 157. The processors 152 and 155 may be combined or alternatively additional processors may be used, e.g., a separate modem processor. The use of a dedicated sensor processor may be useful in lowering power consumption as, e.g., a separate modem process would not need to be turned on to use the magnetometer 100mag and accelerometer 110accel. It will be understood as used herein that processors can, but need not necessarily include, one or more microprocessors, embedded processors, controllers, application specific integrated circuits (ASICs), digital signal processors (DSPs), and the like. The term processor is intended to describe the functions implemented by the system rather than specific hardware. Moreover, as used herein the term "memory" refers to any type of computer storage medium, including long term, short term, or other memory associated with the mobile station, and is not to be limited to any particular type of memory or number of memories, or type of media upon which memory is stored.

The mobile station 100 also includes a user interface 160 that is in communication with the mobile station control 150, e.g., the mobile station control 150 accepts data and controls the user interface 160. The user interface 160 includes a display 162 that displays position information as well as control menus and a keypad 164 or other input device through which the user can input information into the mobile station 100. In one embodiment, the keypad 164 may be integrated into the display 162, such as a touch screen display. The user interface 160 may also include, e.g., a microphone and speaker, e.g., when the mobile station 100 is a cellular telephone.

The methodologies described herein may be implemented by various means depending upon the application. For example, these methodologies may be implemented in the dedicated sensor processor 155, processor 152 or in hardware 156, firmware 157, software 158, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in memory 154 and executed by the processor 152. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored. By way of example, calibration parameters sets may be stored in non-volatile memory.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims. That is, the communication apparatus includes transmission media with signals indicative of information to perform disclosed functions. At a first time, the transmission media included in the communication apparatus may include a first portion of the information to perform the disclosed functions, while at a second time the transmission media included in the communication apparatus may include a second portion of the information to perform the disclosed functions.

Figure 6:
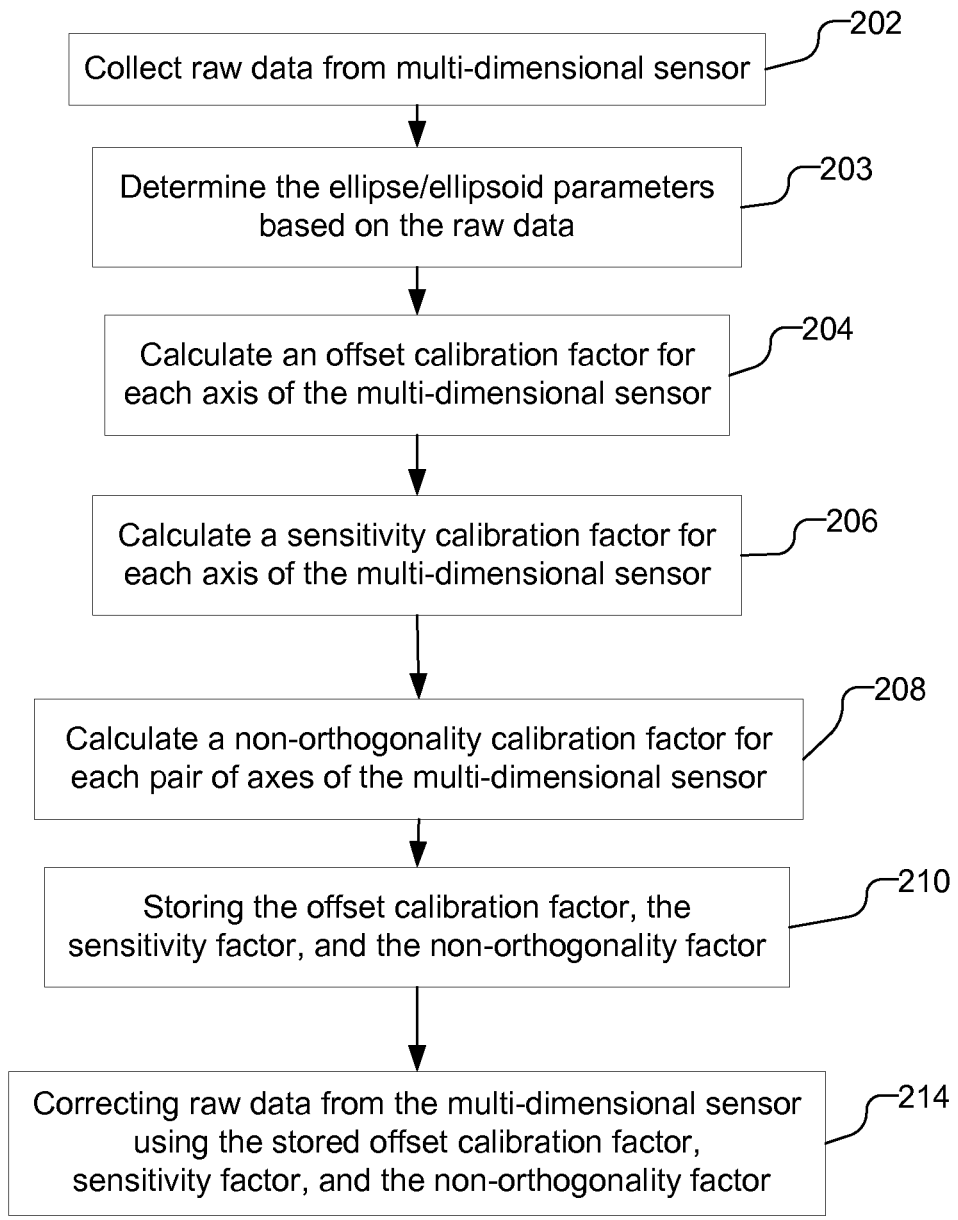
FIG. 6 is a flow chart showing auto-calibration of a multi-dimensional sensor by correcting the raw data from the multi-dimensional sensor based on the collected raw data.

FIG. 6 is a flow chart showing a method of correcting raw data from a multi-dimensional sensor 110 using only the raw data that is provided by the multi-dimensional sensor 110. As illustrated in FIG. 6, raw data is collected from the multi-dimensional sensor 110 (202). From the raw data, the offset, sensitivity and non-orthogonality calibration factors can be determined The raw data is used to determine the ellipse parameters for a two-dimensional sensor or ellipsoid parameters for three-dimensional sensor. For a two-dimensional sensor (or a three-dimensional sensor using only two dimensions), the ellipse parameters A, B, C, D, E, and L may be defined as follows:

$$AB_x^2 + BB_y^2 + 2CB_xB_y + 2DB_x + 2EB_y + L = 0 \quad \text{Eq. 1}$$

where the raw data from the two-dimensional sensor is ($B_x$, $B_y$). It should be understood that the use of "B" to indicate raw data is not necessarily indicative of magnetic field, but may be from any multi-dimensional sensor to be calibrated, including a magnetometer or an accelerometer. For a three-dimensional sensor, the ellipsoid parameters A, B, C, D, E, F, G, H, K, and L may be defined as follow:

$$AB_x^2 + BB_y^2 + CB_z^2 + 2DB_xB_y + 2EB_xB_z + 2FB_yB_z + 2GB_x + 2HB_y + 2KB_z + L = 0 \quad \text{Eq. 2}$$

where the raw data from the three-dimensional sensor is ($B_x$, $B_y$, $B_z$).

For a two-dimensional sensor, the ellipse parameters may be determined by computing the eigenvector of the smallest eigenvalue of $B^HB$, where B is defined as:

$$B = \left( \begin{bmatrix} B_{x,1}^2 & B_{y,1}^2 & 2B_{x,1}B_{y,1} & 2B_{x,1} & 2B_{y,1} & 1 \\ \vdots & \vdots & \vdots & \vdots & \vdots & \vdots \\ B_{x,n}^2 & B_{y,n}^2 & 2B_{x,n}B_{y,n} & 2B_{x,n} & 2B_{y,n} & 1 \end{bmatrix} \right) \quad \text{Eq. 3}$$

where the subscript i indicates the i-th sampling of raw data. To spread out processing over time, $B^HB$ can be determined as follows:

$$R_i = \begin{bmatrix} B_{x,i}^2 \\ B_{y,i}^2 \\ 2B_{x,i}B_{y,i} \\ 2B_{x,i} \\ 2B_{y,i} \\ 1 \end{bmatrix} \begin{bmatrix} B_{x,i}^2 \\ B_{y,i}^2 \\ 2B_{x,i}B_{y,i} \\ 2B_{x,i} \\ 2B_{y,i} \\ 1 \end{bmatrix}^T \quad \text{Eq. 4}$$

$$\left(1 - \exp\left(-\frac{1}{f_cT_c}\right)\right) + R_{i-1}\exp\left(-\frac{1}{f_cT_c}\right)$$

where $T_c$ denotes a time constant of an infinite impulse response (IIR) filter and $f_c$ is the update rate of R. For a three-dimensional sensor, the ellipsoid parameter may be determined by computing the eigenvector in the same manner as described for a two-dimensional sensor, where B and $B^HB$ for a three-dimensional sensor can be easily derived from equations 3 and 4 and equate 2 above. The corresponding equations for the three-dimensional case are:

$$B = \left( \begin{bmatrix} B_{x,1}^2 & B_{y,1}^2 & B_{z,1}^2 & 2B_{x,1}B_{y,1} & 2B_{x,1}B_{z,1} & 2B_{y,1}B_{z,1} & 2B_{x,1} & 2B_{y,1} & 2B_{z,1} & 1 \\ \vdots & \vdots & \vdots & \vdots & \vdots & \vdots & \vdots & \vdots & \vdots & \vdots \\ B_{x,n}^2 & B_{y,n}^2 & B_{z,n}^2 & 2B_{x,n}B_{y,n} & 2B_{x,n}B_{z,n} & 2B_{y,n}B_{z,n} & 2B_{x,n} & 2B_{y,n} & 2B_{z,n} & 1 \end{bmatrix} \right) \quad \text{Eq. 5}$$

where the subscript i indicates the i-th sampling of raw data. To spread out processing over time, $B^HB$ can be determined as follows:

$$R_i = \begin{bmatrix} B_{x,i}^2 \\ B_{y,i}^2 \\ B_{z,i}^2 \\ 2B_{x,i}B_{y,i} \\ 2B_{x,i}B_{z,i} \\ 2B_{y,i}B_{z,i} \\ 2B_{x,i} \\ 2B_{y,i} \\ 2B_{z,i} \\ 1 \end{bmatrix} \begin{bmatrix} B_{x,i}^2 \\ B_{y,i}^2 \\ B_{z,i}^2 \\ 2B_{x,i}B_{y,i} \\ 2B_{x,i}B_{z,i} \\ 2B_{y,i}B_{z,i} \\ 2B_{x,i} \\ 2B_{y,i} \\ 2B_{z,i} \\ 1 \end{bmatrix}^T \quad \text{Eq. 6}$$

$$\left(1 - \exp\left(-\frac{1}{f_cT_c}\right)\right) + R_{i-1}\exp\left(-\frac{1}{f_cT_c}\right)$$

again where $T_c$ denotes a time constant of an infinite impulse response (IIR) filter and $f_c$ is the update rate of R.

The eigenstructure changes slowly over time if the state of the mobile station 100 that affects the magnetometer does not change. Accordingly, the eigendecomposition of R need not be solved from scratch. If the state of the mobile station 100 changes and affects the magnetometer, a calibration set stored in memory may be used, which saves time as to obtain accurate calibration parameters the device has to be rotated. For example, the selection of a calibration stored in memory may be based on the state of the mobile station and/or based on the received raw magnetometer data, from which the best fitting stored calibration set may be determined. Moreover, it may not be practical or economical to store a calibration set for each possible mobile station state (combination of states) during factory calibration. Accordingly, the present process may be used to determine the calibration parameters for the different mobile station states or combinations of states. If the combination of states is known, then the calibration set can be easily tagged and can be used when selecting calibration sets. If the combination of states of the mobile station is only partially known, then the calibration set can be tagged appropriately and multiple calibration sets may have the same tag. In use, the selection algorithm will consider all calibration sets with the appropriate tag, which makes the selection algorithm more robust as it allows a selection of fewer samples. Storing and selecting calibration sets is discussed in U.S. patent application Ser. No. 12/612,529, entitled "Accurate Magnetic Compass in Mobile Electronic Device", by Victor Kulik and Christopher Brunner, filed herewith and having the same assignee as the present disclosure, all of which is incorporated herein by reference.

The matrix R is partially diagonalized using a cyclic Jacobi sweep. Additionally, the eigenvectors E are estimated, which may require more than one Jacobi sweep to obtain an accurate estimate, however, typically one sweep is sufficient. The eigenvector matrix is initialized with E=I where I is the identity matrix. At a fixed rate $f_J$, a cyclic Jacobi sweep is performed on $$R'=E^H R E \qquad \text{Eq. 7}$$

using the previous estimate of the eigenvectors E of the matrix R. Eigenspace tracking is described in "Efficient tracking of eigenspaces and its application to eigenbeamforming", by Michalke, C; Stege, M; Schafer, F; and Fettweis, G; PIMRC 2003 Vol. 3 (2003) pp 2847-2851, which is incorporated herein by reference. Within a few iterations E converges and, as a result, R' diagonalizes. Since the eigenstructure of R changes slowly, the frequency of the Jacobi sweep $f_J$ can be lower than the update rate of R, $f_c$. By way of example, the update rate of R, $f_c$ may be 2 Hz, the time constant $T_c$ may be 100 s and the cyclic Jacobi sweep rate, $f_J$ may be range from 1.0 to 0.1.

After R' has been diagonalized, the diagonal elements correspond to the eigenvalues. The eigenvector corresponding to the smallest eigenvalue can then be selected from E. The ellipse parameters then correspond to the elements of the smallest eigenvector e: A=e1, B=e2, ..., L=e6.

For a three-dimensional sensor, $R_i$ in Eq. 4 is tracked based on the raw data from the three-dimensional sensor to solve for the ellipsoid parameters described.

With the ellipse/ellipsoid parameters determined based on the raw data from the multi-dimensional sensor, the offset, sensitivity and non-orthogonality calibration factors can be determined.

For a three-dimensional sensor 110, the offset factor for each axis of the multi-dimensional sensor may be determined (204) as follows:

$$\text{off}=-pinv(A\text{mat})*a \qquad \text{Eq. 8}$$

where off is the offset calibration factor, pinv denotes the pseudoinverse and where Amat and a are matrices defined as:

$$A\text{mat} = \frac{\begin{bmatrix} A & D & E \\ D & B & F \\ E & F & C \end{bmatrix}}{-L} \qquad \text{Eq. 9}$$

$$a = \frac{\begin{bmatrix} G \\ H \\ K \end{bmatrix}}{-L}. \qquad \text{Eq. 10}$$

The sensitivity calibration factor for each axis of the multi-dimensional sensor can then be determined (206) as follows:

$$\text{scale}=\sqrt{\text{diag}(pinv(A\text{mat}/c\_\text{dash}))} \qquad \text{Eq. 11}$$

where scale is the sensitivity calibration factor and diag denotes the diagonal component of a matrix. The term c_dash is provided by:

$$c\_\text{dash}=1-2*\text{off}'*a-\text{off}'*A\text{mat}*\text{off} \qquad \text{Eq. 12}$$

where off' denotes the transpose of off.

The quality of the sensitivity calibration factor depends on the condition number of the sensitivity calibration factor matrix pinv(Amat/c_dash). The sensitivity calibration factor is not as accurate if the condition number is high as the problem is not as well constrained. Accordingly, if $$\text{cond}(pinv(A\text{mat}/c\_\text{dash}))<t_{condNr} \qquad \text{Eq. 13}$$

is not valid, the last valid sensitivity and non-orthogonality calibration factor before breaching the threshold is used. By way of example, the threshold $t_{condNr}$ maybe 1.5.

The non-orthogonality calibration factor for each axis of the multi-dimensional sensor can then be determined (208) by determining a matrix Q as follows:

$$Q=\text{diag}(1./\text{scale})*pinv(A\text{mat}/C\_\text{dash})*\text{diag}(1./\text{scale}) \qquad \text{Eq. 14}$$

where scale is a vector of length 3, diag( ) indicates turning a vector into a matrix of zeros except for the diagonal and where 1./scale indicates taking the reciprocal of each element, and thus, diag(1./scale) is a 3×3 matrix because scale is a vector of length 3. The matrix Q is used to determine the non-orthogonality calibration factors as follows:

$$\psi=Q(1,2)/2;$$

$$\theta=Q(1,3)/2;$$

$$\phi=Q(2,3)/2; \qquad \text{Eq. 15}$$

where Q(n,m) indicates the element of matrix Q at row n and column m and ψ denotes non-orthogonality in radians in the x-y plane, θ denotes non-orthogonality in radians in the x-z plane; and ϕ denotes non-orthogonality in radians in the y-z plane.

The determined offset, sensitivity, and non-orthogonality calibration factors are stored in memory 154 (210). The raw data from the multi-dimensional sensor can then be corrected using the stored offset, sensitivity, and non-orthogonality calibration factors to produce calibrated data as follows:

$$\hat{B}\text{cal} = \left( pinv(K) * diag(1./\text{scale}) * \begin{bmatrix} (B_x - \text{off}_x) \\ (B_y - \text{off}_y) \\ (B_z - \text{off}_z) \end{bmatrix} \right) \qquad \text{Eq. 16}$$

where $\hat{B}$cal is the corrected raw data, i.e., the calibrated data, $\text{off}_x$, $\text{off}_y$, and $\text{off}_z$ are defined in equation 6, and K is the following matrix $$K = \begin{bmatrix} 1 & \psi & \theta \\ \psi & 1 & \phi \\ \theta & \phi & 1 \end{bmatrix}. \qquad \text{Eq. 17}$$

For a two-dimensional sensor 110, the offset, sensitivity, and non-orthogonality calibration factors are determined in a similar manner based on the ellipse parameters from Eq. 1. For example, for a two-dimensional sensor, the offset calibration factor is determined (204) using Eq. 8, but the matrices Amat and a are defined as follows:

$$A\text{mat} = \frac{\begin{bmatrix} A & C \\ C & B \end{bmatrix}}{-L} \qquad \text{Eq. 18}$$

$$a = \frac{\begin{bmatrix} D \\ E \end{bmatrix}}{-L} \qquad \text{Eq. 19}$$

The sensitivity calibration factor for a two-dimensional sensor is determined (206) using the offset calibration factor and Eq. 11 and Eq. 12. The non-orthogonality calibration factor is then determined (208) using Eq. 14, and $$\psi = Q(1,2)/2; \quad \text{Eq. 20}$$

where $\psi$ denotes non-orthogonality in radians in the x-y plane.

The determined offset, sensitivity, and non-orthogonality calibration factors for the two-dimensional sensor are stored in memory 154 shown in FIG. 5 (210). The raw data from the multi-dimensional sensor can then be corrected using the stored offset, sensitivity, and non-orthogonality calibration factors to produce calibrated data as follows:

$$\hat{B}cal = \left( pinv(R) * diag(1./\text{scale}) * \begin{bmatrix} (B_x - \text{off}_x) \\ (B_y - \text{off}_y) \end{bmatrix} \right) \quad \text{Eq. 21}$$

where $\hat{B}cal$ is the corrected raw data, i.e., the calibrated data, and R is the following matrix $$R = \begin{bmatrix} 1 & \psi \\ \psi & 1 \end{bmatrix} \quad \text{Eq. 22}$$

When the ellipse/ellipsoid parameters are available, the calculations of the offset, sensitivity and non-orthogonality calibration factors may be performed at the same frequency as the update rate of R, $f_c$, discussed above, which may be, e.g., 2 Hz. In one embodiment, however, the calibration calculations could be performed when there is a change in the state of the mobile station 100 or the environment that requires an update. For example, a change in the state of the mobile 100 that may initiate new calibration calculations may include turning a backlight in the display 162 on/off, turning a camera on/off, or turning a vibration setting on/off. A change in the state of the environment that may initiate new calibration calculations may include, e.g., using the mobile station 100 in a car, because the motor block and other metal components have magnetic fields that need to be calibrated out. Calibration because the mobile station 100 is in a car, however, is particularly useful if the mobile station 100 is fixed with respect to the car, i.e., the mobile station 100 is in a cradle.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method comprising:
    collecting raw data for a plurality of axes of a multi-dimensional sensor and providing the collected raw data to a processor;
    iteratively determining at least one of ellipse parameters and ellipsoid parameters using the raw data and at least one of previously determined ellipse parameters and previously determined ellipsoid parameters, wherein iteratively determining at least one of ellipse parameters and ellipsoid parameters using the raw data uses a cyclic Jacobi sweep;
    calculating with the processor an offset calibration factor for each of the plurality of axes of the multi-dimensional sensor based on the at least one of the ellipse parameters and the ellipsoid parameters;
    calculating with the processor a sensitivity calibration factor for each of the plurality of axes of the multi-dimensional sensor based on the calculated offset calibration factor and the at least one of the ellipse parameters and the ellipsoid parameters;
    calculating with the processor a non-orthogonality calibration factor for one or more pairs of axes of the multi-dimensional sensor based on the calculated offset calibration factor, the calculated sensitivity calibration factor and the at least one of the ellipse parameters and the ellipsoid parameters;
    storing the calculated offset calibration factors, the sensitivity calibration factors and one or more non-orthogonality calibration factor in memory coupled to the processor; and
    correcting raw data for the plurality of axes of the multi-dimensional sensor with the processor using the stored calculated offset calibration factors, the sensitivity calibration factors and the one or more non-orthogonality calibration factor.

2. The method of claim 1, wherein the multi-dimensional sensor is a magnetometer and the raw data is collected outside a presence of a disturbing magnetic near field.

3. The method of claim 1, wherein the multi-dimensional sensor is an accelerometer and the raw data is collected while the accelerometer is subjected to no acceleration beyond gravity.

4. The method of claim 1, wherein:
    the offset calibration factor for each of the plurality of axes of the multi-dimensional sensor compensates for at least an offset along each axis of the multi-dimensional sensor;
    the sensitivity calibration factor for each of the plurality of axes of the multi-dimensional sensor compensates for at least a sensitivity of each axis of the multi-dimensional sensor, the sensitivity of each axis being dissimilar; and
    the non-orthogonality calibration factor for the one or more pairs of axes of the multi-dimensional sensor compensates for misalignment between the one or more pairs of axes of the multi-dimensional sensor.

5. The method of claim 1, wherein iteratively determining at least one of ellipse parameters and ellipsoid parameters using the raw data uses a cyclic Jacobi sweep, wherein the ellipse parameters are A, B, C, D, E, and L and are defined by:

$$AB_x^2 + BB_y^2 + 2CB_xB_y + 2DB_x + 2EB_y + L = 0$$

where $B_x$ and $B_y$ are the raw data measured along the plurality of axes of the multi-dimensional sensor, and wherein the ellipsoid parameters are A, B, C, D, E, F, G, H, K and L and are defined by:

$$AB_x^2 + BB_y^2 + CB_z^2 + 2DB_xB_y + 2EB_xB_z + 2FB_yB_z + 2GB_x + 2HB_y + 2KB_z + L = 0$$

where $B_x$, $B_y$, and $B_z$ are the raw data measured along the plurality of axes of the multi-dimensional sensor, and wherein the offset calibration factors, the sensitivity calibration factors and the one or more non-orthogonality calibration factor are calculated based on the at least one of ellipse parameters and ellipsoid parameters.

6. The method of claim 5, wherein ellipsoid parameters are determined, the sensitivity calibration factor for each of the plurality of axes of the multi-dimensional sensor is calculated as:

$$\text{scale} = \sqrt{\text{diag}(pinv(A\text{mat}/c\_\text{dash}))}$$

where scale is the sensitivity calibration factor, diag denotes diagonal components of a matrix, pinv denotes pseudoinverse, and $$Amat = \frac{\begin{bmatrix} A & D & E \\ D & B & F \\ E & F & C \end{bmatrix}}{-L}$$

where c_dash is defined as:

c_dash=1−2*off'*a−off'*Amat*off and where off' is the transpose of off and where off is the offset calibration factor defined as:

$$off = -pinv(Amat) * a$$

and $$a = \frac{\begin{bmatrix} G \\ H \\ K \end{bmatrix}}{-L}.$$

7. The method of claim 6, wherein the non-orthogonality calibration factor for the one or more pairs of axes of the multi-dimensional sensor is calculated as:

Q=diag(1./scale)*pinv(Amat/C_dash)*diag(1./scale)

where Q is a matrix, scale is a vector with length 3, 1./scale indicates taking a reciprocal of each element, and diag( ) indicates turning the vector into a matrix of zeros except for the diagonal components, which correspond to the vector; and

ψ=Q(1,2)/2;

θ=Q(1,3)/2;

φ=Q(2,3)/2;

where ψ denotes non-orthogonality in radians in the x-y plane, θ denotes non-orthogonality in radians in the x-z plane; and φ denotes non-orthogonality in radians in the y-z plane.

8. The method of claim 7, wherein the raw data for the plurality of axes of the multi-dimensional sensor are corrected as follows:

$$\hat{B}cal = \left( pinv(R) * \mathrm{diag}(1./\mathrm{scale}) * \begin{bmatrix} (B_x - \mathit{off}_x) \\ (B_y - \mathit{off}_y) \\ (B_z - \mathit{off}_z) \end{bmatrix} \right)$$

where $\hat{B}cal$ is the corrected raw data and R is matrix as follows:

$$R = \begin{bmatrix} 1 & \psi & \theta \\ \psi & 1 & \phi \\ \theta & \phi & 1 \end{bmatrix}.$$

9. The method of claim 5, wherein ellipse parameters are determined and wherein the sensitivity calibration factor for each of the plurality of axes of the multi-dimensional sensor is calculated as:

scale=√diag(pinv(Amat/c_dash))

where scale is the sensitivity calibration factor, diag denotes diagonal components of a matrix, pinv denotes pseudoinverse, and $$Amat = \frac{\begin{bmatrix} A & C \\ C & B \end{bmatrix}}{-L}$$

where c_dash is defined as:

c_dash=1−2*off'*a−off'*Amat*off and where off' is the transpose of off and where off is the offset calibration factor defined as:

$$off = -pinv(Amat) * a$$

and $$a = \frac{\begin{bmatrix} D \\ E \end{bmatrix}}{-L}.$$

10. The method of claim 9, wherein the non-orthogonality calibration factor for the one or more pairs of axes of the multi-dimensional sensor is calculated as:

Q=diag(1./scale)*pinv(Amat/C_dash)*diag(1./scale)

where Q is a matrix, scale is a vector with length 3, 1./scale indicates taking a reciprocal of each element, and diag( ) indicates turning the vector into a matrix of zeros except for the diagonal components, which correspond to the vector; and

ψ=Q(1,2)/2;

where ψ denotes non-orthogonality in radians in the x-y plane.

11. The method of claim 10, wherein the raw data for the plurality of axes of the multi-dimensional sensor are corrected as follows:

$$\hat{B}cal = \left( pinv(R) * \mathrm{diag}(1./\mathrm{scale}) * \begin{bmatrix} (B_x - \mathit{off}_x) \\ (B_y - \mathit{off}_y) \end{bmatrix} \right)$$

where $\hat{B}cal$ is the corrected raw data and R is matrix as follows:

$$R = \begin{bmatrix} 1 & \psi \\ \psi & 1 \end{bmatrix}.$$

12. A mobile station comprising:
a multi-dimensional sensor that provides raw data for each of a plurality of axes;

a processor connected to the multi-dimensional sensor, the processor receives from the multi-dimensional sensor the raw data for each of the plurality of axes;

memory connected to the processor; and software held in the memory and run in the processor to calibrate the multi-dimensional sensor, the software including instructions to iteratively determine at least one of ellipse parameters and ellipsoid parameters using the raw data and at least one of previously determined ellipse parameters and previously determined ellipsoid parameters wherein the software includes instructions to iteratively determine at least one of ellipse parameters and ellipsoid parameters using the raw data using a cyclic Jacobi sweep, to calculate and store in the memory an offset calibration factor for each of the plurality of axes based on the at least one of the ellipse parameters and the ellipsoid parameters; to calculate and store in the memory a sensitivity calibration factor for each of the plurality of axes based on the calculated offset calibration factor and the at least one of the ellipse parameters and the ellipsoid parameters; and to calculate and store in the memory a non-orthogonality calibration factor for one or more pairs of axes based on the calculated offset calibration factor, the calculated sensitivity calibration factor and the at least one of the ellipse parameters and the ellipsoid parameters; the software further including instructions to correct the raw data for each of the plurality of axes using the stored calculated offset calibration factors, the stored sensitivity calibration factors and the stored one or more non-orthogonality calibration factor.

13. The mobile station of claim 12, wherein the multi-dimensional sensor is at least one of a magnetometer and an accelerometer.

14. The mobile station of claim 12, wherein:

the offset calibration factor for each of the plurality of axes of the multi-dimensional sensor compensates for at least an offset along each axis of the multi-dimensional sensor;

the sensitivity calibration factor for each of the plurality of axes of the multi-dimensional sensor compensates for at least a sensitivity of each axis of the multi-dimensional sensor, the sensitivity of each axis being dissimilar; and the non-orthogonality calibration factor for the one or more pairs of axes of the multi-dimensional sensor compensates for misalignment between the one or more pairs of axes of the multi-dimensional sensor.

15. The mobile station of claim 12, wherein the instructions to determine at least one of ellipse parameters and ellipsoid parameters using the raw data uses a cyclic Jacobi sweep, wherein the ellipse parameters are A, B, C, D, E, and L and are defined by:

$$AB_x^2+BB_y^2+2CB_xB_y+2DB_x+2EB_y+L=0$$

where $B_x$ and $B_y$ are the raw data measured along the plurality of axes of the multi-dimensional sensor, and wherein the ellipsoid parameters are A, B, C, D, E, F, G, H, K and L and are defined by:

$$AB_x^2+BB_y^2+CB_z^2+2DB_xB_y+2EB_xB_z+2FB_yB_z+2GB_x+2HB_y+2KB_z+L=0$$

where $B_x$, $B_y$, and $B_z$ are the raw data measured along the plurality of axes of the multi-dimensional sensor, and wherein the offset calibration factors, the sensitivity calibration factors and the one or more non-orthogonality calibration factor are calculated based on the at least one of ellipse parameters and ellipsoid parameters.

16. The mobile station of claim 15, wherein the software includes instructions to calculate the sensitivity calibration factor for each of the plurality of axes of the multi-dimensional sensor as:

$$\text{scale} = \sqrt{\text{diag}(\text{pinv}(A\text{mat}/c\_\text{dash}))}$$

where scale is the sensitivity calibration factor, diag denotes diagonal components of a matrix, pinv denotes pseudoinverse, and $$A\text{mat} = \frac{\begin{bmatrix} A & D & E \\ D & B & F \\ E & F & C \end{bmatrix}}{-L}$$

where c_dash is defined as:

$$c\_\text{dash}=1-2*\text{off}'*a-\text{off}'*A\text{mat}*\text{off}$$

where off' is the transpose of off and where off is the offset calibration factor defined as:

$$\text{off} = -\text{pinv}(A\text{mat})*a$$

and $$a = \frac{\begin{bmatrix} G \\ H \\ K \end{bmatrix}}{-L}.$$

17. The mobile station of claim 16, wherein software includes instructions to calculate the non-orthogonality calibration factor for the one or more pairs of axes of the multi-dimensional sensor as:

$$Q=\text{diag}(1./\text{scale})*\text{pinv}(A\text{mat}/C\_\text{dash})*\text{diag}(1./\text{scale})$$

where Q is a matrix, scale is a vector with length 3, 1./scale indicates taking a reciprocal of each element, and diag( ) indicates turning the vector into a matrix of zeros except for the diagonal components, which correspond to the vector; and $$\psi=Q(1,2)/2;$$

$$\theta=Q(1,3)/2;$$

$$\phi=Q(2,3)/2;$$

where $\psi$ denotes non-orthogonality in radians in the x-y plane, $\theta$ denotes non-orthogonality in radians in the x-z plane; and $\phi$ denotes non-orthogonality in radians in the y-z plane.

18. The mobile station of claim 17, wherein the software includes instructions to correct the raw data for each of the plurality of axes using the stored calculated offset calibration factors, the stored sensitivity calibration factors and the stored one or more non-orthogonality calibration factor as follows:

$$\hat{B}cal = \left(\text{pinv}(R)*\text{diag}(1./\text{scale})*\begin{bmatrix} (B_x - \text{off}_x) \\ (B_y - \text{off}_y) \\ (B_z - \text{off}_z) \end{bmatrix}\right)$$

where $\hat{B}cal$ is the corrected raw data and R is matrix as follows:

$$R = \begin{bmatrix} 1 & \psi & \theta \\ \psi & 1 & \phi \\ \theta & \phi & 1 \end{bmatrix}.$$

19. The mobile station of claim 15, wherein the software includes instructions to calculate the sensitivity calibration factor for each of the plurality of axes of the multi-dimensional sensor as:

scale=√diag(pinv(Amat/c_dash))

where scale is the sensitivity calibration factor, diag denotes diagonal components of a matrix, pinv denotes pseudoinverse, and $$Amat = \frac{\begin{bmatrix} A & C \\ C & B \end{bmatrix}}{-L}$$

where c_dash is defined as:

c_dash=1−2*off'*a−off'*Amat*off where off' is the transpose of off and where off is the offset calibration factor defined as:

$$off = -pinv(Amat) * a$$

and $$a = \frac{\begin{bmatrix} D \\ E \end{bmatrix}}{-L}.$$

20. The mobile station of claim 19, wherein software includes instructions to calculate the non-orthogonality calibration factor for the one or more pairs of axes of the multi-dimensional sensor as:

Q=diag(1./scale)*pinv(Amat/C_dash)*diag(1./scale)

where Q is a matrix, scale is a vector with length 3, 1./scale indicates taking a reciprocal of each element, and diag( ) indicates turning the vector into a matrix of zeros except for the diagonal components, which correspond to the vector; and

ψ=Q(1,2)/2;

where ψ denotes non-orthogonality in radians in the x-y plane.

21. The mobile station of claim 20, wherein the software includes instructions to correct the raw data for each of the plurality of axes using the stored calculated offset calibration factors, the stored sensitivity calibration factors and the stored one or more non-orthogonality calibration factor as follows:

$$\hat{B}cal = \left( pinv(R) * \text{diag}(1./\text{scale}) * \begin{bmatrix} (B_x - \mathit{off}_x) \\ (B_y - \mathit{off}_y) \end{bmatrix} \right)$$

where $\hat{B}cal$ is the corrected raw data and R is matrix as follows:

$$R = \begin{bmatrix} 1 & \psi \\ \psi & 1 \end{bmatrix}.$$

22. A mobile station comprising:
means for collecting raw data for a plurality of axes of a multi-dimensional sensor;
means for iteratively determining at least one of ellipse parameters and ellipsoid parameters using the raw data and at least one of previously determined ellipse parameters and previously determined ellipsoid parameters, wherein iteratively determining at least one of ellipse parameters and ellipsoid parameters using the raw data uses a cyclic Jacobi sweep;
means for calculating an offset calibration factor for each of the plurality of axes of the multi-dimensional sensor based on the at least one of the ellipse parameters and the ellipsoid parameters;
means for calculating a sensitivity calibration factor for each of the plurality of axes of the multi-dimensional sensor based on the calculated offset calibration factor and the at least one of the ellipse parameters and the ellipsoid parameters;
means for calculating a non-orthogonality calibration factor for one or more pairs of axes of the multi-dimensional sensor based on the calculated offset calibration factor, the calculated sensitivity calibration factor and the at least one of the ellipse parameters and the ellipsoid parameters; and
means for correcting raw data for the plurality of axes of the multi-dimensional sensor using the calculated offset calibration factors, the sensitivity calibration factors and the one or more non-orthogonality calibration factor.

23. The mobile station of claim 22, wherein the multi-dimensional sensor is at least one of a magnetometer and an accelerometer.

24. The mobile station of claim 22, wherein:
the offset calibration factor for each of the plurality of axes of the multi-dimensional sensor compensates for at least an offset along each axis of the multi-dimensional sensor;
the sensitivity calibration factor for each of the plurality of axes of the multi-dimensional sensor compensates for at least a sensitivity of each axis of the multi-dimensional sensor, the sensitivity of each axis being dissimilar; and
the non-orthogonality calibration factor for the one or more pairs of axes of the multi-dimensional sensor compensates for misalignment between the one or more pairs of axes of the multi-dimensional sensor.

25. The mobile station of claim 22, wherein the means for iteratively determining at least one of ellipse parameters and ellipsoid parameters using the raw data uses a cyclic Jacobi sweep, wherein the ellipse parameters are A, B, C, D, E, and L and are defined by:

$AB_x^2+BB_y^2+2CB_xB_y+2DB_x+2EB_y+L=0$ where $B_x$ and $B_y$ are the raw data measured along the plurality of axes of the multi-dimensional sensor, and wherein the ellipsoid parameters are A, B, C, D, E, F, G, H, K and L and are defined by:

$AB_x^2+BB_y^2+CB_z^2+2DB_xB_y+2EB_xB_z+2FB_yB_z+2GB_x+2HB_y+2KB_z+L=0$ where $B_x$, $B_y$, and $B_z$ are the raw data measured along the plurality of axes of the multi-dimensional sensor, and wherein the offset calibration factors, the sensitivity calibration factors and the one or more non-orthogonality calibration factor are calculated based on the at least one of ellipse parameters and ellipsoid parameters.

26. The mobile station of claim 25, wherein the means for calculating the sensitivity calibration factor calculates the sensitivity calibration factor as:

scale=$\sqrt{\text{diag}(\text{pinv}(A\text{mat}/c\_\text{dash}))}$ where scale is the sensitivity calibration factor, diag denotes diagonal components of a matrix, pinv denotes pseudoinverse, and $$Amat = \frac{\begin{bmatrix} A & D & E \\ D & B & F \\ E & F & C \end{bmatrix}}{-L}$$

where c_dash is defined as follows:

c_dash=1−2*off'*a−off'*Amat*off where off' is the transpose of off and where off is the offset calibration factor defined as:

off = −pinv(Amat)*a and $$a = \frac{\begin{bmatrix} G \\ H \\ K \end{bmatrix}}{-L}.$$

27. The mobile station of claim 26, wherein the means for calculating the non-orthogonality calibration factor calculates the non-orthogonality calibration factor as:

Q=diag(1./scale)*pinv(Amat/C_dash)*diag(1./scale)

where Q is a matrix, scale is a vector with length 3, 1./scale indicates taking a reciprocal of each element, and diag( ) indicates turning the vector into a matrix of zeros except for the diagonal components, which correspond to the vector; and

ψ=Q(1,2)/2;

θ=Q(1,3)/2;

φ=Q(2,3)/2;

where ψ denotes non-orthogonality in radians in the x-y plane, θ denotes non-orthogonality in radians in the x-z plane; and φ denotes non-orthogonality in radians in the y-z plane.

28. The mobile station of claim 26, further comprising a means for correcting the raw data that corrects the raw data as:

$$\hat{B}cal = \left( pinv(R) * \text{diag}(1./\text{scale}) * \begin{bmatrix} (B_x - \text{off}_x) \\ (B_y - \text{off}_y) \\ (B_z - \text{off}_z) \end{bmatrix} \right)$$

where $\hat{B}cal$ is the corrected raw data and R is matrix as follows:

$$R = \begin{bmatrix} 1 & \psi & \theta \\ \psi & 1 & \phi \\ \theta & \phi & 1 \end{bmatrix}.$$

29. The mobile station of claim 25, wherein the means for calculating the sensitivity calibration factor calculates the sensitivity calibration factor as:

scale=$\sqrt{\text{diag}(\text{pinv}(A\text{mat}/c\_\text{dash}))}$ where scale is the sensitivity calibration factor, diag denotes diagonal components of a matrix, pinv denotes pseudoinverse, and $$Amat = \frac{\begin{bmatrix} A & C \\ C & B \end{bmatrix}}{-L}$$

where c_dash is defined as:

c_dash=1−2*off'*a−off'*Amat*off where off' is the transpose of off and where off is the offset calibration factor defined as:

off = −pinv(Amat)*a and $$a = \frac{\begin{bmatrix} D \\ E \end{bmatrix}}{-L}.$$

30. The mobile station of claim 29, wherein the means for calculating the non-orthogonality calibration factor calculates the non-orthogonality calibration factor as:

Q=diag(1./scale)*pinv(Amat/C_dash)*diag(1./scale)

where Q is a matrix, scale is a vector with length 3, 1./scale indicates taking a reciprocal of each element, and diag( ) indicates turning the vector into a matrix of zeros except for the diagonal components, which correspond to the vector; and

ψ=Q(1,2)/2;

where ψ denotes non-orthogonality in radians in the x-y plane.

31. The mobile station of claim 30, further comprising a means for correcting the raw data that corrects the raw data as:

$$\hat{B}cal = \left( pinv(R) * \text{diag}(1./\text{scale}) * \begin{bmatrix} (B_x - \text{off}_x) \\ (B_y - \text{off}_y) \end{bmatrix} \right)$$

where $\hat{B}cal$ is the corrected raw data and R is matrix as follows:

$$R = \begin{bmatrix} 1 & \psi \\ \psi & 1 \end{bmatrix}.$$

32. A non-transitory computer-readable medium including program code stored thereon, comprising:

program code to iteratively determine at least one of ellipse parameters and ellipsoid parameters using collected raw data and at least one of previously determined ellipse parameters and previously determined ellipsoid parameters, wherein the program code to iteratively determine at least one of ellipse parameters and ellipsoid parameters using the collected raw data uses a cyclic Jacobi sweep;

program code to calculate an offset calibration factor for each of a plurality of axes of a multi-dimensional sensor based on the at least one of the ellipse parameters and the ellipsoid parameters for the plurality of axes of the multi-dimensional sensor;

program code to calculate a sensitivity calibration factor for each of the plurality of axes of the multi-dimensional sensor based on the calculated offset calibration factor and the at least one of the ellipse parameters and the ellipsoid parameters for the plurality of axes of the multi-dimensional sensor;

program code to calculate a non-orthogonality calibration factor for one or more pairs of axes of the multi-dimensional sensor based on the calculated offset calibration factor, the calculated sensitivity calibration factor and the at least one of the ellipse parameters and the ellipsoid parameters for the plurality of axes of the multi-dimensional sensor; and program code to correct raw data for the plurality of axes of the multi-dimensional sensor using the calculated offset calibration factors, the sensitivity calibration factors and the one or more non-orthogonality calibration factor.

33. The non-transitory computer-readable medium of claim 32, wherein the program code to iteratively determine at least one of ellipse parameters and ellipsoid parameters using the raw data uses a cyclic Jacobi sweep, wherein the ellipse parameters are A, B, C, D, E, and L and are defined by:

$$AB_x^2 + BB_y^2 + 2CB_xB_y + 2DB_x + 2EB_y + L = 0$$

where $B_x$ and $B_y$ are the raw data measured along the plurality of axes of the multi-dimensional sensor, and wherein the ellipsoid parameters are A, B, C, D, E, F, G, H, K and L and are defined by:

$$AB_x^2 + BB_y^2 + CB_z^2 + 2DB_xB_y + 2EB_xB_x + 2FB_yB_z + 2GB_x + 2HB_y + 2KB_z + L = 0$$

where $B_x$, $B_y$, and $B_z$ are the raw data measured along the plurality of axes of the multi-dimensional sensor, and wherein the offset calibration factors, the sensitivity calibration factors and the one or more non-orthogonality calibration factor are calculated based on the at least one of ellipse parameters and ellipsoid parameters.

34. The non-transitory computer-readable medium of claim 33, wherein the program code to calculate the sensitivity calibration factor calculates the sensitivity calibration factor as:

$$\text{scale} = \sqrt{\text{diag}(pinv(Amat/c\_dash))}$$

where scale is the sensitivity calibration factor, diag denotes diagonal components of a matrix, pinv denotes pseudoinverse, and $$Amat = \frac{\begin{bmatrix} A & D & E \\ D & B & F \\ E & F & C \end{bmatrix}}{-L}$$

where c_dash is defined as:

$$c\_dash = 1 - 2*off'*a - off'*Amat*off$$

where off' is the transpose of off and where off is the offset calibration factor defined as:

$$off = -pinv(Amat)*a$$

and $$a = \frac{\begin{bmatrix} G \\ H \\ K \end{bmatrix}}{-L}.$$

35. The non-transitory computer-readable medium of claim 34, wherein the program code to calculate the non-orthogonality calibration factor calculates the non-orthogonality calibration factor as:

$$Q = \text{diag}(1./\text{scale})*pinv(Amat/C\_dash)*\text{diag}(1./\text{scale})$$

where Q is a matrix, scale is a vector with length 3, 1./scale indicates taking a reciprocal of each element, and diag( ) indicates turning the vector into a matrix of zeros except for the diagonal components, which correspond to the vector; and $$\psi = Q(1,2)/2;$$

$$\theta = Q(1,3)/2;$$

$$\phi = Q(2,3)/2;$$

where $\psi$ denotes non-orthogonality in radians in the x-y plane, $\theta$ denotes non-orthogonality in radians in the x-z plane; and $\phi$ denotes non-orthogonality in radians in the y-z plane.

36. The non-transitory computer-readable medium of claim 35, wherein the program code to correct the raw data corrects the raw data as:

$$\hat{B}cal = \left( pinv(R) * \text{diag}(1./\text{scale}) * \begin{bmatrix} (B_x - off_x) \\ (B_y - off_y) \\ (B_z - off_z) \end{bmatrix} \right)$$

where $\hat{B}cal$ is the corrected raw data and R is matrix as follows:

$$R = \begin{bmatrix} 1 & \psi & \theta \\ \psi & 1 & \phi \\ \theta & \phi & 1 \end{bmatrix}.$$

37. The non-transitory computer-readable medium of claim 33, wherein the program code to calculate the sensitivity calibration factor calculates the sensitivity calibration factor as:

$$scale = \sqrt{diag(pinv(Amat/c\_dash))}$$

where scale is the sensitivity calibration factor, diag denotes diagonal components of a matrix, pinv denotes pseudoinverse, and $$Amat = \frac{\begin{bmatrix} A & C \\ C & B \end{bmatrix}}{-L}$$

where c_dash is defined as:

$$c\_dash = 1 - 2*off'*a - off'*Amat*off$$

where off' is the transpose of off and where off is the offset calibration factor defined as:

$$off = -pinv(Amat)*a$$

and $$a = \frac{\begin{bmatrix} D \\ E \end{bmatrix}}{-L}.$$

38. The non-transitory computer-readable medium of claim 37, wherein the program code to calculate the non-orthogonality calibration factor calculates the non-orthogonality calibration factor as:

$$Q = diag(1./scale)*pinv(Amat/C\_dash)*diag(1./scale)$$

where Q is a matrix, scale is a vector with length 3, 1./scale indicates taking a reciprocal of each element, and diag( ) indicates turning the vector into a matrix of zeros except for the diagonal components, which correspond to the vector; and $$\psi = Q(1,2)/2;$$

where $\psi$ denotes non-orthogonality in radians in the x-y plane.

39. The non-transitory computer-readable medium of claim 38, wherein the program code to correct the raw data corrects the raw data as:

$$\hat{B}cal = \left( pinv(R) * diag(1./scale) * \begin{bmatrix} (B_x - off_x) \\ (B_y - off_y) \end{bmatrix} \right)$$

where $\hat{B}cal$ is the corrected raw data and R is matrix as follows:

$$R = \begin{bmatrix} 1 & \psi \\ \psi & 1 \end{bmatrix}.$$

* * * * *